United States Patent [19]
Omoya et al.

[11] Patent Number: 5,641,996
[45] Date of Patent: Jun. 24, 1997

[54] SEMICONDUCTOR UNIT PACKAGE, SEMICONDUCTOR UNIT PACKAGING METHOD, AND ENCAPSULANT FOR USE IN SEMICONDUCTOR UNIT PACKAGING

[75] Inventors: Kazunori Omoya; Takashi Oobayashi; Wataru Sakurai; Mitsuru Harada; Yoshihiro Bessho, all of Osaka, Japan

[73] Assignee: Matsushita Electric Industrial Co., Ltd., Osaka, Japan

[21] Appl. No.: 593,675

[22] Filed: Jan. 29, 1996

[30] Foreign Application Priority Data

Jan. 30, 1995 [JP] Japan ................................. 7-012779
Jun. 12, 1995 [JP] Japan ................................. 7-144373

[51] Int. Cl.⁶ ............................................. H01L 23/28
[52] U.S. Cl. ........................... 257/787; 257/780; 257/783
[58] Field of Search .................................. 257/737, 787, 257/779, 780, 781, 783, 786, 795, 789; 437/211, 212, 219

[56] References Cited

U.S. PATENT DOCUMENTS

| | | | |
|---|---|---|---|
| 4,604,644 | 8/1986 | Beckham et al. ................. | 437/211 |
| 4,999,699 | 3/1991 | Christie et al. . | |
| 5,121,190 | 6/1992 | Hsiao et al. . | |
| 5,128,746 | 7/1992 | Pennisi et al. ................... | 257/783 |
| 5,136,365 | 8/1992 | Pennisi et al. ................... | 257/783 |
| 5,194,930 | 3/1993 | Papathomas et al. ............ | 257/773 |
| 5,292,688 | 3/1994 | Hsiao et al. ...................... | 437/211 |
| 5,371,404 | 12/1994 | Juskey et al. ..................... | 257/795 |
| 5,436,503 | 7/1995 | Kunitomo et al. ................ | 257/737 |
| 5,442,240 | 8/1995 | Mukerji ............................ | 257/783 |
| 5,450,283 | 9/1995 | Lin et al. ........................... | 257/787 |
| 5,550,408 | 8/1996 | Kunitomo et al. ................ | 257/783 |

OTHER PUBLICATIONS

Patent Abstracts of Japan, vol. 018, No. 590 (E–1628) (Nov. 10, 1994) and JP–A–6–224259 (Aug. 12, 1994).
Patent Abstracts of Japan, vo. 016, No. 397 (E–1252) (Aug. 24, 1992) and JP–A–4–130633 (May 1, 1992).
Database WPI, Sec. Ch. Week 8850, Derwent Publ. Ltd., London, GB and JP–A–63–268724 (Nov. 7, 1988).
Database WPI, Sec. Ch., Week 8910, Derwent Publ. Ltd., London, GB and JP–A–1–029416 (Jan. 31, 1989).
Database WPI, Sec. Ch., Week 9504, Derwent Publ. Ltd., London, GB and JP–A–6–313027 (Nov. 8, 1994).
Database WPI, Sec. Ch., Week 9444, Derwent Publ. Ltd., London, GB and JP–A–6–279654 (Oct. 4, 1994).

*Primary Examiner*—Mahshid D. Saadat
*Assistant Examiner*—S. V. Clark
*Attorney, Agent, or Firm*—McDermott, Will & Emery

[57] ABSTRACT

An improved semiconductor unit package is disclosed. This package is implemented by a semiconductor device having an electrode pad, a substrate having a terminal electrode, a bump electrode formed on the electrode pad, a conductive adhesion layer with flexibility, and an encapsulating layer formed by curing a composition the viscosity and thixotropy index of which are below 100 Pa·s and below 1.1, respectively. Such a composition essentially consists of (A) a resin binder that contains, for example, a polyepoxide, an acid anhydride, and a rheology modifier and (B) a filler. The rheology modifier is one capable of impeding interaction between a free acid contained in the acid anhydride and a polar group at the surface of the filler. An encapsulant with improved flowability is used, so that the encapsulant readily flows and spreads to fill a gap between the semiconductor device and the substrate with no air bubbles. This achieves semiconductor unit packages with high reliability and productivity.

29 Claims, 7 Drawing Sheets

BISPHENOL TYPE EPOXY RESIN

TRIALKYLTETRAHYDROPHTHALIC ACID

SEMICONDUCTOR UNIT PACKAGE, SEMICONDUCTOR UNIT PACKAGING METHOD, AND ENCAPSULANT FOR USE IN SEMICONDUCTOR UNIT PACKAGING

BACKGROUND OF THE INVENTION

This invention is directed generally to a semiconductor unit package and to a semiconductor unit packaging method. More specifically, the present invention pertains to a technique wherein a semiconductor device is mounted by means of flip-chip bonding onto a substrate, with a conductive adhesive sandwiched therebetween, and the substrate and the semiconductor device are mechanically connected together, with a resin encapsulating layer sandwiched therebetween.

Generally, solder interconnection has been used for establishing interconnections between connection terminals of electronic components such as semiconductor devices and terminal electrodes of circuit patterns on a substrate. As the size of semiconductor packages has been decreased dramatically, and as the spacing between connection terminals has been reduced owing to, for example, increase in the number of connection terminals, conventional soldering finds it difficult to catch up with such recent advances, since it requires large adhesive area.

Various flip-chip bonding approaches, in which the chip is flipped or inverted such that its active element surface faces the substrate and is directly connected to the substrate with terminal electrodes, have been proposed for effective use of packaging areas. Typical examples of the flip-chip bonding are described below.

(1) Junction By Low Melting-Point Metal

As shown in FIG. 8, a solder bump electrode 8 is formed on an electrode pad 2 of a semiconductor device 1. The solder bump electrode 8 is aligned with a terminal electrode 5 on a substrate 6. Thereafter, solder is melted to establish electrical connection between the semiconductor device 1 and the substrate 6. FIG. 9 shows a technique similar to the one of FIG. 8. In this technique, a bump electrode 3 of gold is formed. A deposit of a low melting-point metal, e.g., a deposit 9 of indium, is formed between the gold bump electrode 3 and the terminal electrode 5. The indium deposit 9 is melted and the bump electrode 3 and the terminal electrode 5 are electrically connected together. Subsequently, the semiconductor device 1 and the substrate 6 are mechanically connected together, with an encapsulating layer 10 sandwiched therebetween.

(2) Junction By Curing Contraction Stress

As shown in FIG. 10, a bump electrode 3 of gold is formed on an electrode pad 2 of a semiconductor device 1. Alignment of the bump electrode 3 on the semiconductor device 1 with a terminal electrode 5 on a substrate 6 is carried out. Then, an encapsulating material is filled between the semiconductor device 1 and the substrate 6. This encapsulating material cures or hardens to form an encapsulating layer 12. Contraction stress produced by such hardening results in application of compressive stress between the bump electrode 3 and the terminal electrode 5, whereupon the bump electrode 3 and the terminal electrode 5 are electrically connected together and, at the same time, the semiconductor device 1 and the substrate 6 are mechanically connected together. Additionally, in order to improve connection reliability, a deposit 11 of gold may be formed on the terminal electrode 5 (see FIG. 10).

(3) Junction By Anisotropic Conductive Adhesive

Referring now to FIG. 11, a bump electrode 3 of gold is formed on an electrode pad 2 of a semiconductor device 1. An anisotropic conductive adhesive, which includes a binder in which conductive particles are dispersed, is filled between the semiconductor device 1 and a substrate 6. This conductive adhesive is heated while at the same time having application of pressure, whereupon it cures or hardens to form an anisotropic conductive adhesive layer 13. As a result, the bump electrode 3 and a terminal electrode 5 are electrically connected together and, at the same time, the semiconductor device 1 and the substrate 6 are mechanically connected together.

(4) Junction By Conductive Adhesive

As shown in FIG. 12, a bump electrode 3 of gold is formed on an electrode pad 2 of a semiconductor device 1. Thereafter, a conductive adhesive is transferred to the bump electrode 3. Alignment of the bump electrode 3 with a terminal electrode 5 formed on a substrate 6 is carried out and thereafter the transferred conductive adhesive cures to form a conductive adhesive layer 4. As a result, the bump electrode 3 and the terminal electrode 5 are electrically connected together, with the conductive adhesive layer 4 sandwiched therebetween. An encapsulating material is filled between the semiconductor device 1 and the substrate 6, as a result of which the semiconductor device 1 and the substrate 6 are mechanically connected together. This encapsulating material cures to form an encapsulating layer 7, whereupon the semiconductor device 1 and the substrate 6 are mechanically connected together. A typical encapsulating material has a composition essentially formed of (a) a resin binder including a cresol NOVOLAC type epoxy resin and a NOVOLAC type phenol resin (curing agent) and (b) a filler formed of dielectric particles.

The above-described packaging techniques (1)–(4), however, have their respective drawbacks.

The packaging techniques (1) and (2) have the problem that, since their structures have difficulties in reducing thermal stress produced by the difference in expansion coefficient between semiconductor device and substrate, they are unsuitable for applications where connection stability is required over a wide range of temperature.

Next, the packaging technique (3) is discussed. The packaging technique (3) employs an anisotropic conductive adhesive that contains a resin binder formed of a resin material with high flexibility, thereby making it possible to reduce thermal stress. In spite of such an advantage, the hygroscopic of the resin binder increases and the packaging technique (3) suffers the problem of connection stability under conditions of high humidity. Additionally, in the packaging technique (3). it is possible to reduce thermal stress by matching the thermal expansion coefficient of the binder with that of the semiconductor device 1 and with that of the substrate 6. However, a filler having a low thermal expansion coefficient is contained in large amounts, so that connection reliability at the early stage is likely to be degraded.

Finally, the packaging technique (4) is discussed. This packaging technique (4) is able to reduce thermal stress by a conductive adhesive with flexibility and by matching the thermal expansion coefficient of the encapsulating material with that of the semiconductor device 1 and with that of the substrate 6. Because of such an advantage, the packaging technique (4) appears to be most attractive as compared to the other packaging techniques.

The packaging technique (4), however, has the following drawbacks. The previously-described encapsulant, which is formed of a mixture composition of (A) a cresol NOVOLAC type epoxy resin and (B) a NOVOLAC type phenol resin, has a high viscosity coefficient. Additionally, matching of thermal expansion coefficients requires a high proportion in content of a filler in the encapsulant, resulting in increasing the viscosity of the encapsulant. Therefore, at the time of filling such an encapsulant between the semiconductor device and the substrate, it becomes necessary to heat the encapsulant up to 70–80 degrees centigrade or more to reduce the viscosity. This results in poor productivity. Further, at the time of the encapsulant filling, conductive interconnections may be damaged by thermal stress produced by the thermal expansion difference when temperature is increased, thereby reducing connection reliability.

On the other hand, a resin binder as an encapsulant may be used which is formed essentially of (A) a polyepoxide the viscosity of which is very low at normal room temperature and (B) an acid anhydride. Note that "polyepoxide" is a general term for epoxy resins and/or epoxy compounds. However, if a large quantity of a filler is added to such a resin binder for the purpose of reducing the thermal expansion coefficient, this will hold the viscosity of the encapsulant low but increase the thixotropy index. This produces the problem that the encapsulant is unable to enter between the semiconductor device and the substrate, or the problem that, even if the encapsulant manages to enter, such entrance is accompanied with a great number of air bubbles. The presence of such air bubbles in the encapsulant contributes to non-uniformity in, for example, thermal expansion of the cured encapsulant. Connection reliability is reduced. For this reason, it has been considered impractical to use a resin of polyepoxide and acid anhydride as a binder.

SUMMARY OF THE INVENTION

Bearing in mind the above-described problems with the prior art techniques, this invention was made. Accordingly a general object of the present invention is to provide an improved semiconductor unit package and associated packaging method capable of achieving high connection reliability and high productivity. The inventors of the present invention investigated the limitation of the characteristics of viscosity and thixotropy index necessary for obtaining desirable encapsulating characteristics of fillers. It is to be noted that "polyepoxide" is a general term for epoxy resins and/or epoxy compounds.

The inventors of this invention found out the fact that the reason that conventional materials are unsuitable for an encapsulant lies not only in viscosity but also in thixotropy index (high thixotropy index). For example, for the case of resin binders containing polyepoxides and acid anhydrides, the inventors of the present invention found out that the flowability is impeded by interaction between free acids in the acid anhydride and polar groups at the surface of a filler. From this knowledge found out by the present inventors, the following means are provided to achieve the object of the present invention.

More specifically, in accordance with the present invention, a composition, the viscosity and the thixotropy of which are below 100 Pa·s and below 1.1, respectively, is used as an encapsulating material in the flip-chip bonding. This composition cures to form an encapsulating layer by which a semiconductor device and a substrate are mechanically connected together.

The present invention provides a semiconductor unit package that comprises:

(a) a semiconductor device having an electrode pad;

(b) a substrate having a terminal electrode;

(c) a bump electrode formed on the electrode pad of the semiconductor device;

(d) a conductive adhesive layer which is formed of a conductive adhesive with flexibility and which establishes an electrical connection between the bump electrode and the terminal electrode; and (e) an encapsulating layer which is formed by curing a composition having a viscosity of below 100 Pa·s and a thixotropy index of below 1.1 and which fills a gap defined between the semiconductor device and the substrate in such a way that the semiconductor device and the substrate are mechanically joined together.

The encapsulating layer, which mechanically joins a semiconductor device and a substrate, is formed of an encapsulant, which is in the state of liquid in a packaging step and which has not only a low viscosity coefficient of below 100 Pa·s but also a low thixotropy index of below 1.1. As a result of such arrangement, in a packaging step, such an encapsulant readily flows and spreads, even into tiny gaps with no air bubbles. The temperature of filling may be decreased. These arrangements make it possible to improve not only electrical connection reliability (e.g., semiconductor device-to-substrate adhesion, and resistance to thermal shock) but also productivity.

It is preferred that the composition consists essentially of (A) a resin binder that contains at least a polyepoxide, a carboxylic acid's anhydride, a rheology modifier, and a latent curing accelerator, and (B) a filler that is formed of a dielectric material, and that the rheology modifier functions to impede interaction between a free acid in the anhydride of the carboxylic acid and a polar group at the surface of the filler.

It is preferred that the rheology modifier contains a substance capable of selective adsorption of the free acid in the anhydride of the carboxylic acid.

It is preferred that the rheology modifier is a Lewis-base compound.

It is preferred that the rheology modifier is either a tertiary amine compound, a tertiary phosphine compound, a quaternary ammonium salt, a quaternary phosphonium salt, or a heterocyclic compound that contains in a cyclic chain thereof an atom of nitrogen.

As described above, the encapsulant is formed essentially of (A) an acid anhydride-curing type epoxy resin and (B) a material having a low thermal expansion coefficient (e.g., a dielectric material). This arrangement reduces thermal stresses applied to the encapsulating layer. Additionally, the rheology modifier used is a rheology modifier operable to impede interaction between a free acid in the acid anhydride and a polar group at the surface of the filler and hence a low viscosity coefficient and a low thixotropy index can be achieved.

It is preferred that the anhydride of the carboxylic acid in the resin binder contains at least an anhydride of an alicyclic acid.

It is preferred that the foregoing alicyclic acid anhydride contains at least an anhydride of a trialkyltetrahydrophthalic acid.

The characteristics of alicyclic acid's anhydrides with low water absorption are utilized to give the desirable resistance of resin binder to moisture. Additionally, the viscosity of the resin binder which is in the state of liquid in a packaging step is low, so that encapsulant filling can be finished in a short time. The costs of production can be cut down.

It is preferred that the bump electrode of the semiconductor device is a stud bump electrode with a two stepped protuberance.

Such arrangement makes it possible to increase the density of bump electrode. When mounting a semiconductor device onto a substrate, densely-placed bump electrodes of the semiconductor device and terminal electrodes on the substrate are electrically connected together. Subsequently, an encapsulant having a low viscosity coefficient and a low thixotropy index is employed so that it can readily flow and fill a gap defined between the semiconductor device and the substrate. As a result, even in high-density semiconductor units, electrical and mechanical connections between semiconductor device and substrate are improved in reliability.

The present invention provides a semiconductor unit packaging method wherein a semiconductor device having an electrode pad is mounted on a substrate having a terminal electrode. More specifically, this method comprises:

(a) a first step of forming a bump electrode on the electrode pad of the semiconductor device;

(b) a second step of applying a conductive adhesive around the tip of the bump electrode;

(c) a third step comprising:
  performing alignment of the bump electrode and the terminal electrode;
  placing the semiconductor device onto the substrate; and
  establishing, through the conductive adhesive, an electrical connection between the bump electrode and the terminal electrode;

(d) a fourth step of preparing an encapsulant formed of a composition the viscosity and thixotropy index of which are below 100 Pa·s and below 1.1, respectively;

(e) a fifth step of filling a gap defined between the semiconductor device and the substrate with the encapsulant; and (f) a sixth step of curing the encapsulant to mechanically joint the semiconductor device and the substrate.

Since the encapsulant has not only a low viscosity coefficient of below 100 Pa·s but also a low thixotropy index of below 1.1, this makes it possible for such an encapsulant in a packaging step to readily flow and spread, even into tiny gaps with no air bubbles. The temperature of filling may be decreased. These arrangements make it possible to improve not only electrical connection reliability (e.g., semiconductor device-to-substrate adhesion, and resistance to thermal shock) but also productivity, and to shorten the packaging time.

It is preferred that the composition of the fourth step consists essentially of (A) a resin binder that contains at least a polyepoxide, an anhydride of a carboxylic acid, a rheology modifier, and a latent curing accelerator, and (B) a filler that is formed of a dielectric material, and that the rheology modifier functions to impede interaction between a free acid in the carboxylic acid's anhydride and a polar group at the surface of the filler.

Such arrangement makes it possible to reduce both the viscosity and thixotropy index of the encapsulant in the fifth step. Additionally, the encapsulant is formed essentially of (A) an acid anhydride-curing type epoxy resin and (B) a material having a low thermal expansion coefficient (e.g., a dielectric material). This arrangement reduces thermal stresses applied after the packaging to the encapsulating layer.

It is preferred that the rheology modifier contains a substance, which acts also as a curing accelerator for a double-liquid epoxy resin type encapsulant, by such a trace amount as to prevent the substance from exhibiting its curing function.

Such arrangement controls an encapsulant in such a way that the encapsulant does not start curing between the fourth step and the fifth step and is cured in the sixth step. When cured in the sixth step, a rheology modifier is incorporated into an encapsulating resin layer's network structure. This eliminates the possibility that addition of a rheology modifier reduces resistance to heat and resistance to moisture.

It is preferred that the anhydride of the carboxylic acid in the resin binder of the fourth step contains at least an anhydride of an alicyclic acid.

It is preferred that the alicyclic acid anhydride of the fourth step contains at least an anhydride of a trialkyltetrahydrophthalic acid.

Since an anhydride of an alicyclic acid is low in viscosity as well as in water absorption, time required for filling of an encapsulant in the sixth step is reduced, and resistance to moisture is enhanced.

It is preferred that the bump electrode of the first step is a stud bump electrode with a two stepped protuberance.

Such arrangement enables the high-density placement of bump electrodes, and the encapsulant, which is low in viscosity as well as in thixotropy index, readily spreads, even into tiny gaps defined between the densely-placed bump electrodes and terminal electrodes of the substrates. As a result, electrical and mechanical connections between semiconductor device and substrate are improved in reliability.

It is preferred that in the fifth step the encapsulant is injected between the semiconductor device and the substrate at room temperature.

Such arrangement achieves a reduction of the thermal stress thereby improving resistance to thermal shock. As a result, a semiconductor unit package with improved electrical connection reliability is achieved.

It is preferred that in the fifth step the encapsulant is injected between the semiconductor device and the substrate under a depressurized condition.

Such arrangement not only achieves an improvement in productivity but also provides a semiconductor unit package with improved electrical connection reliability.

It is preferred that in the fourth step the composition of the encapsulant is prepared by providing a mixture of an anhydride of a carboxylic acid and a part of a filler, subjecting the mixture to an aging process, and adding a polyepoxide and the remaining filler to the mixture.

As a result of such arrangement, interaction between a free acid and a polar group is diminished. This achieves an encapsulant having a low viscosity and a low thixotropy index.

It is preferred that the rheology modifier contains a substance capable of selective adsorption of the free acid in the anhydride of the carboxylic acid.

As a result of such arrangement, a free acid in an acid anhydride is selectively adsorbed by a rheology modifier, whereupon interaction between free acid and polar group is impeded. This achieves an encapsulant having a low viscosity and a low thixotropy index.

It is preferred that the rheology modifier is a Lewis-base compound.

It is preferred that the rheology modifier is either a tertiary amine compound, a tertiary phosphine compound, a quaternary ammonium salt, a quaternary phosphonium salt, or a heterocyclic compound that contains in a cyclic chain thereof an atom of nitrogen.

As a result of such arrangements, interaction between free acid and polar group is impeded. This achieves an encapsulant having a low viscosity and a low thixotropy index.

The present invention provides an encapsulant for filling a gap between a semiconductor device and a substrate for use in the packaging of a semiconductor unit. This encapsulant essentially consists of:

(A) a resin binder that contains at least a polyepoxide, an anhydride of a carboxylic acid, a rheology modifier, and a latent curing accelerator wherein the weight percentage of the resin binder is within the range of from 80% to 25%; and (B) a filler that is formed of a dielectric material wherein the weight percentage of the filler is within the range of from 20% to 75%;

wherein the rheology modifier functions to impede interaction between a free acid in the anhydride of the carboxylic acid and a polar group at the surface of the filler.

Since the encapsulant has not only a low viscosity coefficient of below 100 Pa·s but also a low thixotropy index of below 1.1, this makes it possible for such an encapsulant to readily flow and spread, even into tiny gaps with no air bubbles. The temperature of filling may be lowered. Additionally, the latent curing accelerator ensures the storage stability of the encapsulant and practical curing accelerant function. These arrangements make it possible to improve not only electrical connection reliability (e.g., semiconductor device-to-substrate adhesion, and resistance to thermal shock) but also productivity.

It is preferred that the rheology modifier contains a substance capable of selective adsorption of the free acid in the anhydride of the carboxylic acid.

It is preferred that the rheology modifier is a Lewis-base compound.

It is preferred that the rheology modifier is either a tertiary amine compound, a tertiary phosphine compound, a quaternary ammonium salt, a quaternary phosphonium salt, or a heterocyclic compound that contains in a cyclic chain thereof an atom of nitrogen.

The encapsulant is formed essentially of (A) an acid anhydride-curing type epoxy resin and (B) a material having a low thermal expansion coefficient (e.g., a dielectric material). This arrangement reduces thermal stresses applied to the encapsulating layer in a semiconductor unit package to be formed. Additionally, the rheology modifier used is a rheology modifier operable to impede interaction between a free acid in the acid anhydride and a polar group at the surface of the filler and hence a low viscosity coefficient and a low thixotropy index can be achieved.

It is preferred that the anhydride of the carboxylic acid in the resin binder contains at least an anhydride of an alicyclic acid.

It is preferred that the aforesaid alicyclic acid anhydride contains at least an anhydride of a trialkyltetrahydrophthalic acid.

The characteristics of alicyclic acid's anhydrides with low water absorption are utilized to give the desirable resistance of resin binder to moisture. Additionally, the viscosity of the resin binder which is in the state of liquid in a packaging step is low, so that encapsulant filling can be finished in a short time. The costs of packaging can be cut down.

It is preferred that the resin binder and the filler are arranged to stay as a single liquid.

Such arrangement facilitates uniform dispersion of the filler thereby providing a desirable encapsulant for the manufacture of LSIs.

It is preferred that the resin binder in the encapsulant has a composition wherein:

(a) the chemical equivalent ratio of the anhydride of the carboxylic acid to the polyepoxide is within the range of from 0.8 to 1.1;

(b) the weight percentage of the curing accelerator to the entirety of the resin binder is within the range of from 0.3% to 3%; and (c) the weight percentage of the rheology modifier to the entirety of the resin binder is within the range of from 0.02% to 0.3%.

The present invention provides an encapsulant for filling a gap between a semiconductor device and a substrate for use in the packaging of a semiconductor unit. This encapsulant essentially consists of:

(A) a resin binder that contains at least a polyepoxide, an anhydride of a carboxylic acid, a rheology modifier, and a latent curing accelerator wherein the weight percentage of the resin binder is within the range of from 80% to 25%; and (B) a filler that is formed of a dielectric material wherein the weight percentage of the filler is within the range of from 20% to 75%;

wherein the encapsulant is prepared by:
providing a mixture of an anhydride of a carboxylic acid and a part of a filler;
subjecting the mixture to an aging process; and
adding a polyepoxide and the remaining filler to the mixture.

As a result of such arrangement, interaction between the free acid in the anhydride of the carboxylic acid and the polar group at the surface of the filler, is suppressed and the thixotropy index of the encapsulant is reduced.

DETAILED DESCRIPTION OF THE INVENTION

Preferred embodiments of the present invention are described by making reference to the accompanying drawing figures.

Figure 1:
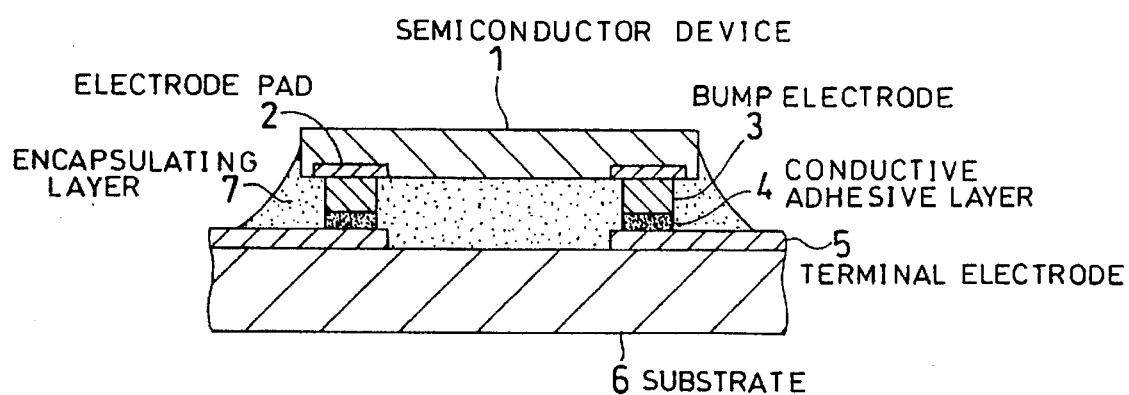
FIG. 1 is a cross-section of a semiconductor unit of an embodiment in accordance with the present invention.
Figure 2:
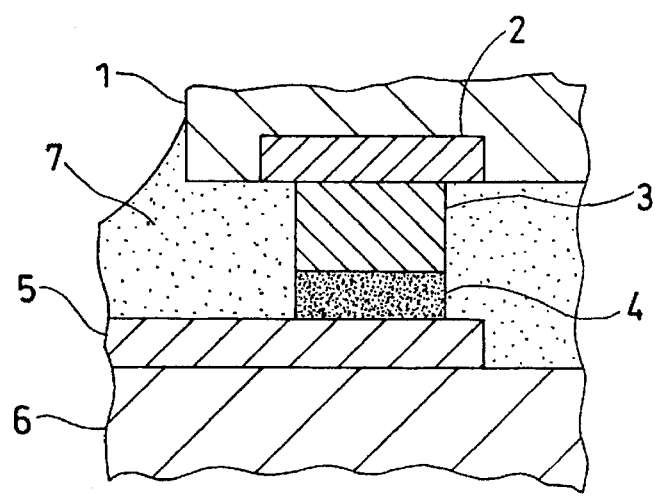
FIG. 2 is a cross-section of a joint of the FIG. 1 semiconductor unit.

FIG. 1 is a cross section depicting a semiconductor unit package in accordance with the present invention. FIG. 2 is a cross section of a joint of the FIG. 1 semiconductor unit package. This semiconductor unit package is formed by a flip-chip bonding method. Reference numeral 1 denotes a semiconductor device such as an LSI chip. Reference numeral 2 denotes an electrode pad formed in the semiconductor device 1. Reference numeral 3 denotes a bump electrode of gold. Reference numeral 4 denotes a conductive adhesive layer of a composition (i.e., a conductive adhesive) essentially formed of a special epoxy resin and conductive powders of, for example, an alloy of AgPd. Reference numeral 6 is a substrate, e.g., a ceramic substrate, onto which the semiconductor device 1 is mounted. Reference numeral 5 denotes a terminal electrode formed on the substrate 6. Reference numeral 7 denotes an encapsulating layer formed of an encapsulant. Such an encapsulant is essentially formed of an acid anhydride-curing type epoxy resin. This encapsulant 7, when it remains fluid, has a thixotropy index of below 1.1 and a viscosity coefficient of 100 Pa·s. The encapsulant 7 is injected between the semiconductor device 1 and the substrate 6 by capillary action and is cured. It is to be noted that the thixotropy index is the index expressed by $\Delta\eta/\Delta\epsilon$ where $\epsilon$ is the shear rate and $\eta$ is the viscosity coefficient. Here, the thixotropy index when the shear rate $\epsilon$ falls in the range of 2 (1/sec) to 20 (1/sec), is shown.

Figure 3:
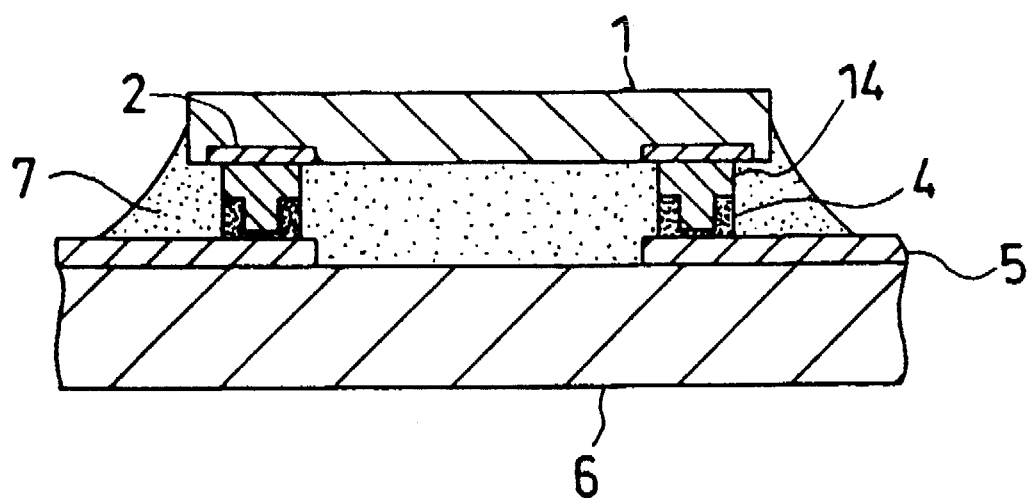
FIG. 3 is a cross-section of a semiconductor unit formed by a stud bump technique of an embodiment in accordance with the present invention.

FIG. 3 is a cross-section of a semiconductor unit package by means of a flip-chip bonding method using a stud bump electrode. The semiconductor unit package of FIG. 3 and the semiconductor unit package of FIG. 1 are basically the same, except that the former semiconductor unit package employs a stud bump electrode 14 with a two stepped protuberance instead of the bump electrode 13. Employment of a flip-chip bonding method using a stud bump electrode with a two stepped protuberance makes it possible to deal with a semiconductor device with a greater number of electrode pads, which is detailed later.

Figure 4A:
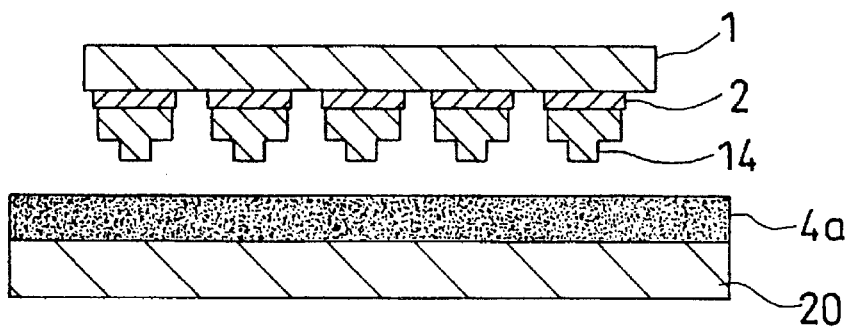
FIGS. 4(a)–4(e) are cross-sections of a semiconductor unit at different process stages of a flip-chip bonding technique of an embodiment in accordance with the present invention.
Figure 4B:
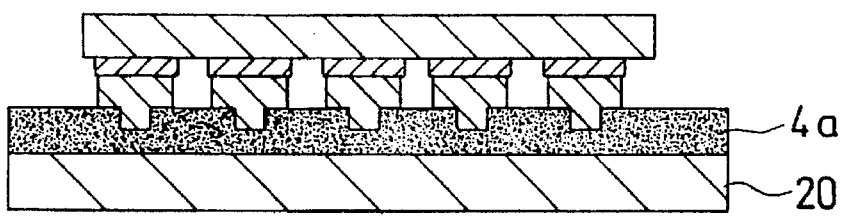
Figure 4C:
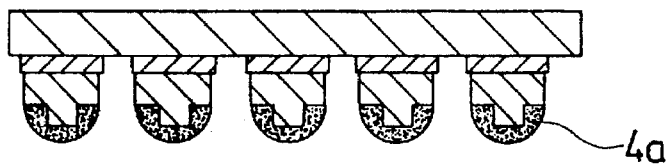
Figure 4D:
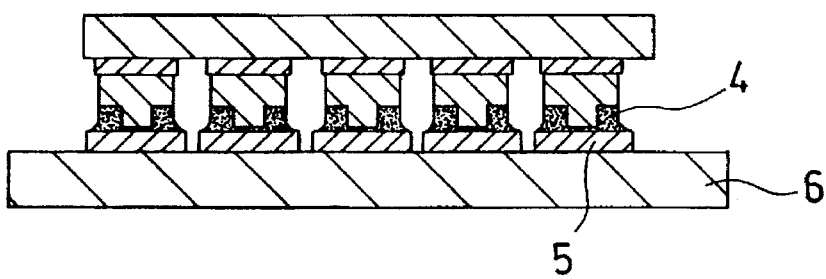
Figure 4E:
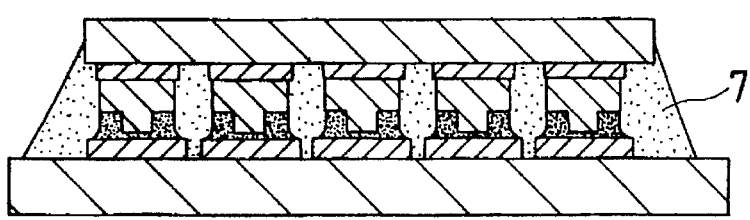
Figure 5:
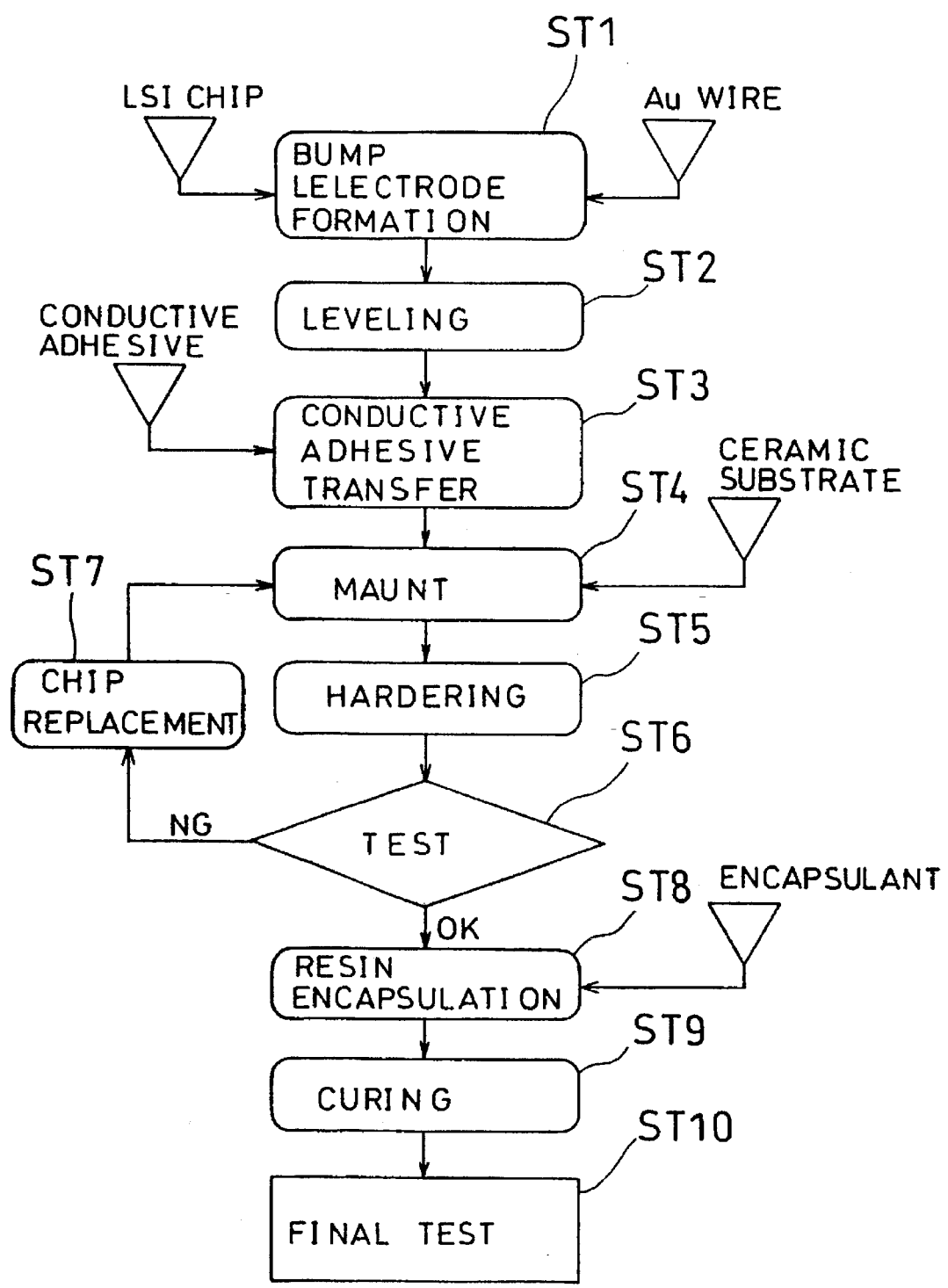
FIG. 5 is a flow diagram showing steps of a flip-chip bonding technique of an embodiment in accordance with the present invention.

A flip-chip bonding method, which uses the stud bump electrode 14 of FIG. 3, is illustrated by making reference to FIGS. 4(a)–4(e) and to FIG. 5. FIGS. 4(a)–4(e) are cross-sections of a semiconductor unit package at different stages of a flip-chip bonding method. FIG. 5 is a flow diagram showing steps of the flip-chip bonding method. The packaging process is described step by step with reference to FIG. 5.

At step ST1, an wire of gold (Au) is used to form stud bump electrodes 14 at electrode pads 2 in the semiconductor device (LSI chip) 1. At step ST2, a leveling process is carried out and each stud bump electrode 14 is pressed against a level surface so that the leading ends of the stud bump electrodes 14 are flush with one another.

Next, at step ST3, as shown in FIGS. 4(a)–4(c), the semiconductor device 1, with the side of the stud bump electrode 14 facing down, is placed above a substrate 20 with application of a conductive adhesive 4a. Thereafter, the semiconductor device 1 is lowered towards the substrate 20 such that the stud bump electrode 14 is soaked in the conductive adhesive 4a on the substrate 20. Subsequently, the semiconductor device 1 is lifted up, as a result of which transfer of the conductive adhesive 4a onto the stud bump electrode 14 is completed.

Next, at steps ST4 and ST5, as shown in FIG. 4(d), the semiconductor device 1 is placed onto the ceramic substrate 6 having thereon the terminal electrode 5. At this time, alignment of the stud bump electrode 14 of the semiconductor device 1 with the terminal electrode 5 of the substrate 6 is carried out, and the conductive adhesive 4a is heated to cure to form the conductive adhesive layer 4. As a result, the stud bump electrode 14 of the semiconductor device 1 and the terminal electrode 5 of the substrate 6 are electrically connected together.

At step ST6, testing for the presence or absence of an electrical connection failure is carried out. If an electrical connection failure is found, chip replacement is carried out at step ST7 and the flip-chip bonding process returns back to step ST4. If no electrical connection failure is found, the process advances to step ST8.

At step ST8, an encapsulant, which is formed of a composition having a low viscosity of below 100 Pa·s and a low thixotropy index of below 1.1, is injected between the semiconductor device 1 and the substrate 6 at normal room temperature to resin-encapsulate connection parts. Subsequently, at step ST9, a heating treatment is carried out to cure a resin binder contained in the injected encapsulant. As a result, the encapsulating layer 7 is formed (see FIG. 4(e)), whereupon the semiconductor device 1 and the substrate 6 are mechanically connected together by the encapsulating layer 7.

At step ST10, final testing is made and the flip-chip bonding process is completed.

The present embodiment employs a low-viscosity, low thixotropy-index encapsulant. This produces the advantages that an encapsulant injection process can be done smoothly even at room temperature and the encapsulant injected readily flows and well spreads to fill a tiny gap between the semiconductor device 1 and the substrate 6. This is time saving, and the connection reliability of a joint made by the conductive adhesive 4 can be maintained. Additionally, the encapsulant is a composition essentially formed of (a) an acid anhydride-curing type epoxy resin with improved flowability and (b) a filler such a fused silica, in other words it has a low post-curing thermal expansion coefficient. Since the coefficient of thermal expansion of the encapsulating layer 7 is low, this controls thermal stresses produced by the differences in the coefficient of thermal expansion between the semiconductor device 1 of silicon and the substrate 6 of, for example, alumina. Additionally, an encapsulant, formed of a resin of the epoxy group, exhibits high resistance to heat and has strong adhesion, therefore achieving connection reliability that remains stable even under high temperature and high humidity conditions.

Since the conductive adhesive 4 has great flexibility, this contributes to reducing thermal stresses and connection reliability is further improved.

In the present embodiment, the bump electrode 3 is formed of gold. Other functionally equivalent metals, e.g., copper, may be used to form the bump electrode 3. Additionally, in the present embodiment, the stud bump electrode 14 is used. Other types of bump electrodes used in usual flip-chip bonding techniques may be used. It is, however, to be noted that use of stud bump electrodes controls lateral spreading of the conductive adhesive layer 4 thereby achieving a much higher packaging density.

In the present embodiment, the conductive adhesive 4 is formed of a material of the epoxy group. Other materials with flexibility may be used, e.g., a material of the rubber group (e.g., SBR, NBR, IR, BR, CR), a material of the acrylic group, a material of the polyester group, a material of the polyamide group, a material of the polyether group, a material of the polyurethane group, a material of the polyimide group, and a material of the silicon group. As a conductive powder material that is contained in the conductive adhesive, powders of noble metals (silver, gold, palladium), powders of base metals (nickel, copper), powders of alloys (solder, AgPd), mixture powders of silver-plated copper, and powders of nonmetals with conductivity (carbon). These powders may be used separately or in combination. The diameter of powders is not limited to a particular one. The shape of powders is not limited to a particular one.

Figure 6:
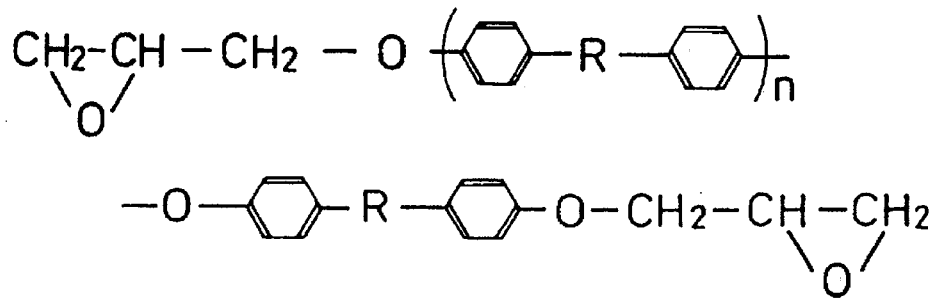
FIG. 6 shows the generic chemical composition of a bisphenol type epoxy resin in a resin binder used in an embodiment in accordance with the present invention.

The encapsulant is formed essentially of (A) a resin binder and (B) a filler. The resin binder's essential components are a polyepoxide, an acid anhydride, and a rheology modifier. Such a polyepoxide is the so-called epoxy compounds (epoxy resins) and there are no limitations on its elements. Examples of the polyepoxide are a bisphenol type epoxy resin (see the FIG. 6), a NOVOLAC type epoxy resin, a glycidylether type epoxy resin, a glycidylester type epoxy resin, a glycidylamine type epoxy resin, an alicyclic type epoxy resin, a biphenyl type epoxy resin, a naphthalene type epoxy resin, a styrene oxide, an alkylglycidylether, and an alkylglycidylester. They are used separately or in combination.

Figure 7:
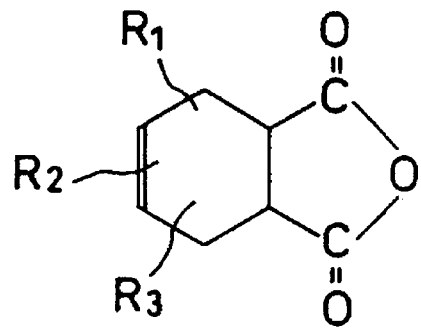
FIG. 7 shows the generic chemical composition of a trialkyltetrahydrophthalic acid in a resin binder used in an embodiment in accordance with the present invention.
Figure 8:
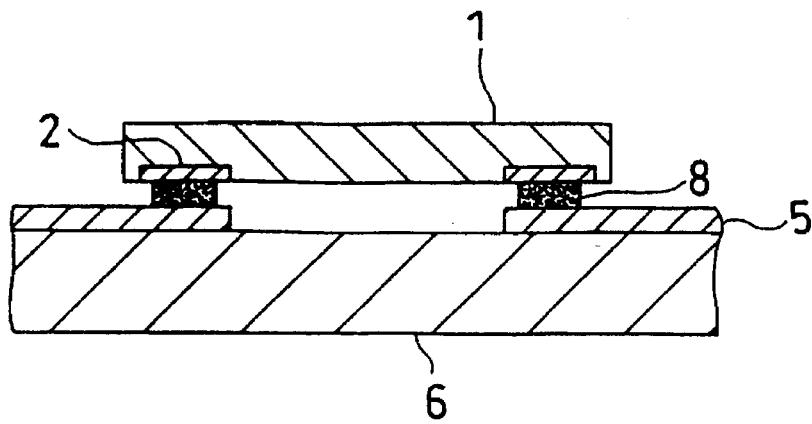
FIG. 8 is a cross section of a conventional semiconductor unit in which connection is established by a solder bump electrode.

As the acid anhydride used here in the present invention, curing agents for epoxy compounds and epoxy resins may be used. One of the most preferable acid anhydrides is a trialkyltetrahydrophthalic acid's anhydride (see FIG. 7). Other preferable ones are a methyltetrahydrophthalic acid's anhydride, and a methylhexahydrophthalic acid's anhydride and a methylhymic acid's anhydride of the cyclic aliphatic group that are in the state of liquid at 25 degrees centigrade. Other acid anhydrides may be used. These acid anhydrides may be used separately or in combination. If these acid anhydrides mentioned above are used as predominant elements of the resin binder, this provides an improved encapsulant that has very low viscosity, high heat resistance, high humidity resistance, and high adhesion.

In addition to the foregoing essential elements of the resin binder, a third binder element may be added as required, for improvement in heat resistance, humidity resistance, adhesion strength and for adjustment of thermal expansion coefficient, rheology, and reactivity.

Any powdery filler may be used as one of the predominant elements of the encapsulant as long as its average particle diameter falls in the range of from 1 μm to 50 μm. For example, silica oxides, alumina oxides, aluminum nitrides, silicon carbides, and silicification compounds all of which are thermally stable and have low thermal expansion coefficients. These filler elements are used in any combination. There are no particular limits on the filler dose, preferably 20–80 percent, on a weight basis, of the entirety of the encapsulant. Use of these filler elements achieves an improved encapsulant which is superior in insulation and which produces less thermal stress.

Any rheology modifier for modification of the encapsulant flowability may be used as long as it functions to prevent a free acid in the acid anhydride from interacting with a polar group at the surface of the filler and to reduce the thixotropy index of the encapsulant. The following are preferred examples of the rheology modification.

(1) Rheology Modification Method I

In Method 1, an acid anhydride is pre-mixed with a part of a filler. The mixture is subjected to an aging process. For example, the mixture may be heated up to 100 degrees centigrade or less. This is followed by addition of a polyepoxide compound, the remaining filler, and other addition agents, to obtain a desirable encapsulant.

(2) Rheology Modification Method II

In Method II, a substance capable of selective adsorption of free acids in an acid anhydride is added to an encapsulant.

(3) Rheology Modification Method III

In Method III, a substance (e.g., a Lewis-base compound having neither N—H groups nor O—H groups) that interacts more strongly with a free acid than a polar group at the surface of a filler, is added to an encapsulant.

Suitable Lewis-base compounds include tertiary amine compounds, tertiary phosphine compounds, quaternary ammonium salts such as the tetrabutylammonium bromide, quaternary phosphonium salts such as the tetrabutylphosphoniumbenzotriazolate, melamines, and heterocyclic compounds that contain in cyclic chains thereof atoms of nitrogen such as imidazole compounds. There are many Lewis-base compounds other than the above. These Lewis-base compounds may be used separately or in combination.

The encapsulant may contain, as required, a solvent, a dispersing agent, a rheology regulatory agent such as a leveling agent, an adhesion improving agent such as a coupling agent, or a reaction regulatory agent such as a curing accelerator.

The rheology modifier of the present invention, which consists of a Lewis-base compound such as the amine compound, is usually used as a reaction (curing) accelerator between a polyepoxide and an anhydride of an carboxylic acid.

When the rheology modifier is used as a curing accelerator for an encapsulant, curing reaction progresses even when stored at low temperature to enter the stage of gel. This limits the type of encapsulant to double-liquid type ones, in other words mixing must be made just before use. On the other hand, LSI encapsulant require that large amounts of fillers must be dispersed uniformly, in other words a single-liquid type encapsulant is required for LSI.

To sum up, the rheology modifier of the present invention may be used as a curing accelerator for a double-liquid type encapsulant but not for a single-liquid type encapsulant.

If the dose is reduced to such an extent as to prevent gelling during the storage, the present rheology modifier may find applications in the single-liquid type encapsulant. In such a case, a curing accelerant function that the rheology modifier performs is too poor to meet practical requirements, in other words no high-level encapsulant curing characteristics are obtained.

The present invention is characterized in that it employs a latent curing accelerator with both storage stability and practical curing accelerant functions, and that substances, e.g., amines, which are usually used as a curing accelerator for the double-liquid type encapsulant, are employed as a rheology modifier. Such a rheology modifier is added in such an amount that it performs no curing functions but functions to improve interface characteristics.

A latent curing accelerator is the catalyst whose catalyst activities are greatly promoted upon application of, for example, thermal energy. Generally, latent curing accelerators are melted (liquefied) or reaction-dissociated upon application of energy, to be enhanced in activity.

It is preferred that the encapsulant has the following composition.

|  | Wt. percent |
| --- | --- |
| Resin binder | 80–25 |
| Filler element | 20–75 |

It is preferred that the resin binder essentially consists of a polyepoxide, an anhydride of a carboxylic acid, a curing accelerator, and a rheology modifier according to the following element ratios.

|  | Equivalent ratio |
| --- | --- |
| Carboxylic acid's anhydride/Polyepoxide | 0.8–1.1 |
|  | Wt. percent |
| Curing accelerator/Resin binder | 0.3–3 |
| Rheology modifier/Resin binder | 0.02–0.3 |

In the present invention, the substrate 6 is formed of ceramic (e.g., alumina). Metal glaze substrates, glass substrates, resin substrates (e.g., glass epoxy substrates), polymer film substrates are applicable.

There are no specific limitations on the material of the terminal electrode 5.

The following are embodiments for investigation of the characteristics of semiconductor units obtained by the above-described flip-chip bonding method.

EMBODIMENT 1

A semiconductor unit with the FIG. 1 structure is formed in accordance with steps of FIGS. 4(a)–4(e). Bump electrode 3 is formed by means of gold plating. Conductive adhesive 4a has a composition formed essentially of powders of AgPd and an epoxy resin with flexibility. Conductive adhesive 4a is heated at 120 degrees centigrade and, as a result, cures. Further, an encapsulant of COMPOSITION a in TABLE 1 is cured at 150 degrees centigrade.

EMBODIMENT 2

Stud bump electrode 14 of FIG. 3 is formed on electrode pad 2 of semiconductor device 1 by means of a gold-wire bonder. The following steps are the same as the first embodiment and are carried out under the same conditions as the first embodiment.

EMBODIMENT 3

Semiconductor device 1 is mounted onto substrate 6 under the same conditions as the first embodiment, except that in the third embodiment an encapsulant injection process is carried out under depressurized condition.

EMBODIMENT 4

Semiconductor device 1 is mounted onto substrate 6 under the same conditions as the second embodiment, except that in the fourth embodiment COMPOSITION b of TABLE 1 is used.

EMBODIMENT 5

Semiconductor device 1 is mounted onto substrate 6 under the same conditions as the second embodiment, except that in the fifth embodiment substrate 6 is a glass epoxy substrate and COMPOSITION c of TABLE 1 is used.

EMBODIMENT 6

Semiconductor device 1 is mounted onto substrate 6 under the same conditions as the second embodiment, except that in the sixth embodiment substrate 6 is a glass epoxy substrate, conductive adhesive 4 contains powders of silver as conductive powders, and COMPOSITION d of TABLE 1 is used.

EMBODIMENT 7

Semiconductor device 1 is mounted onto substrate 6 under the same conditions as the second embodiment, except that in the seventh embodiment substrate 6 is a glass substrate, conductive adhesive 4 is formed essentially of powders of silver and an urethane resin, COMPOSITION e of TABLE 1 is used, and encapsulant injection is carried out under depressurized condition.

EMBODIMENT 8

Bump electrode 3 of FIG. 1 is formed on electrode pad 2 of semiconductor device 1 by means of gold plating. Semiconductor device 1 is mounted onto substrate 6 in the same way as the seventh embodiment and under the same conditions as the seventh embodiment.

COMPARE EXAMPLE 1

Semiconductor device 1 is mounted onto substrate 6 under the same conditions as the second embodiment, except that in the first compare example COMPOSITION f of TABLE 1 is used.

COMPARE EXAMPLE 2

Semiconductor device 1 is mounted onto substrate 6 under the same conditions as the second embodiment, except that in the second compare example COMPOSITION g of TABLE 1 is used.

COMPOSITIONS a–g are shown below.

TABLE 1

| COMPOSITION a: | |
| --- | --- |
| bisphenol F type epoxy resin (epoxy equivalent: 162) | 85 phr |
| bisphenol A type epoxy resin (epoxy equivalent: 182) | 15 phr |
| trialkyltetrahydro phthalic acid's-anhydride (anhydride equiv.: 234) | 126 phr |
| 2-(2-methylimidazolylethyl)-4, 6-diamino triazine-isocyanuric acid addition product | 1.6 phr |
| diazabicycloundecene | 0.1 phr |
| fused silica | 340 phr |
| COMPOSITION b: | |
| trialkyltetrahydro phthalic acid's anhydride (anhydride equiv.: 234) | 126 phr |
| fused silica | 340 phr |
| These two material were kneaded and subjected to an aging process for 10 hours at 60 degrees centigrade. Thereafter the following materials were added to them. | |
| bisphenol F type epoxy resin (epoxy equivalent: 162) | 85 phr |
| bisphenol A type epoxy resin (epoxy equivalent: 182) | 15 phr |
| 2-(2-methylimidazolylethyl)-4, 6-diamino triazine-isocyanuric acid addition product | 1.6 phr |
| 1-cyanoethyl-2-ethyl-4-methylimidazole | 0.2 phr |
| COMPOSITION c: | |
| bisphenol F type epoxy resin (epoxy equivalent: 162) | 80 phr |
| alicyclic epoxy resin (ERL4221)* | 20 phr |
| trialkyltetrahydro phthalic acid's anhydride (anhydride equiv.: 234) | 135 phr |
| AMICURE PN** | 5 phr |
| tetrabutylammonium bromide | 0.2 phr |
| fused silica | 400 phr |

TABLE 1-continued

COMPOSITION d:

| | |
|---|---|
| bisphenol F type epoxy resin (epoxy equivalent: 162) | 90 phr |
| bisphenol A type epoxy resin (epoxy equivalent: 182) | 10 phr |
| trialkyltetrahydro phthalic acid's anhydride (anhydride equiv.: 234) | 128 phr |
| FUJIHARD FXE1000*** | 5 phr |
| tetrabutylphosphoniumbenzotriazolate | 0.2 phr |
| fused silica | 350 phr |

COMPOSITION e:

| | |
|---|---|
| bisphenol F type epoxy resin (epoxy equivalent: 162) | 70 phr |
| naphthalene type epoxy resin (epoxy equivalent: 148) | 30 phr |
| trialkyltetrahydro phthalic acid's anhydride (anhydride equiv.: 234) | 82 phr |
| methyltetrahydro phthalic acid's anhydride (anhydride equiv.: 166) | 40 phr |
| triphenylphosphinetriphenylborate | 3.6 phr |
| tetrabutylphosphoniumbenzotriazolate | 0.2 phr |
| fused silica | 225 phr |

COMPOSITION f:

| | |
|---|---|
| bisphenol F type epoxy resin (epoxy equivalent: 162) | 85 phr |
| bisphenol A type epoxy resin (epoxy equivalent: 182) | 15 phr |
| trialkyltetrahydro phthalic acid's anhydride (anhydride equiv.: 234) | 126 phr |
| 2-(2-methylimidazolylethyl)-4, 6-diamino triazine-isocyanuric acid addition product | 1.6 phr |
| fused silica | 340 phr |

COMPOSITION g:

| | |
|---|---|
| bisphenol F type epoxy resin (epoxy equivalent: 162) | 100 phr |
| alkyl modified phenol resin (hydroxyl group equiv: 113) | 70 phr |
| triphenylphosphine | 0.6 phr |
| fused silica | 255 phr |

Note:
*= product by UCC;
**= product by AJINOMOTO; and
***= product by FUJI KASEI

COMPARE EXAMPLE 3

Figure 9:
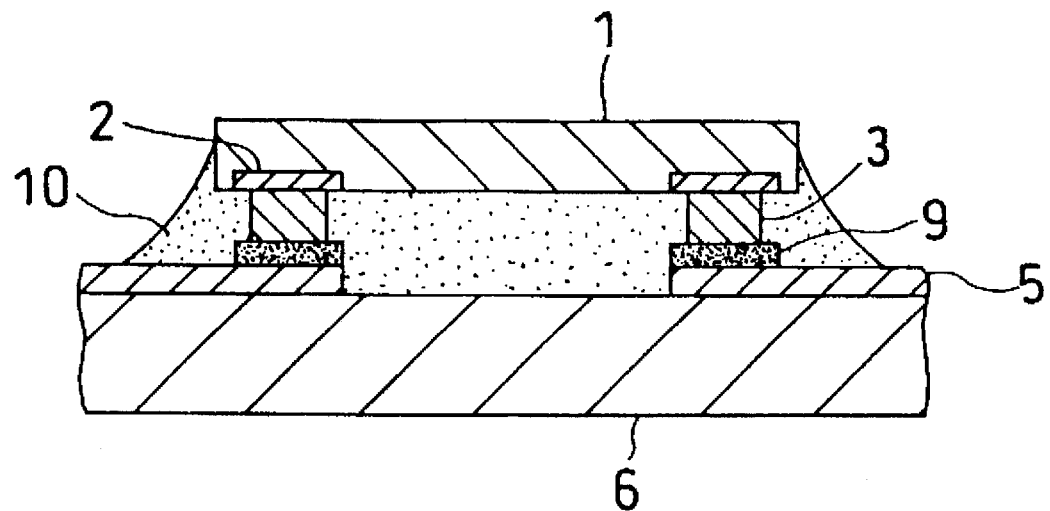
FIG. 9 is a cross section of a conventional semiconductor unit in which connection is established by a low melting-point metal layer.

Semiconductor device 1 is mounted onto substrate 6 in a conventional way shown in FIG. 9. Substrate 6 is an alumina substrate. Bump electrode 3 is formed of gold. Terminal electrode 5 is indium-plated. Alignment of bump electrode 3 with terminal electrode 5 is carried out and, thereafter semiconductor device 1 is pressed by a jig and, at the same time, is heated up to 170 degrees centigrade, whereupon bump electrode 3 and terminal electrode 5 is connected together. Further, a silicon encapsulant of zero stress type is injected between semiconductor device 1 and substrate 6. This encapsulant is cured to form encapsulating layer 10.

COMPARE EXAMPLE 4

Figure 10:
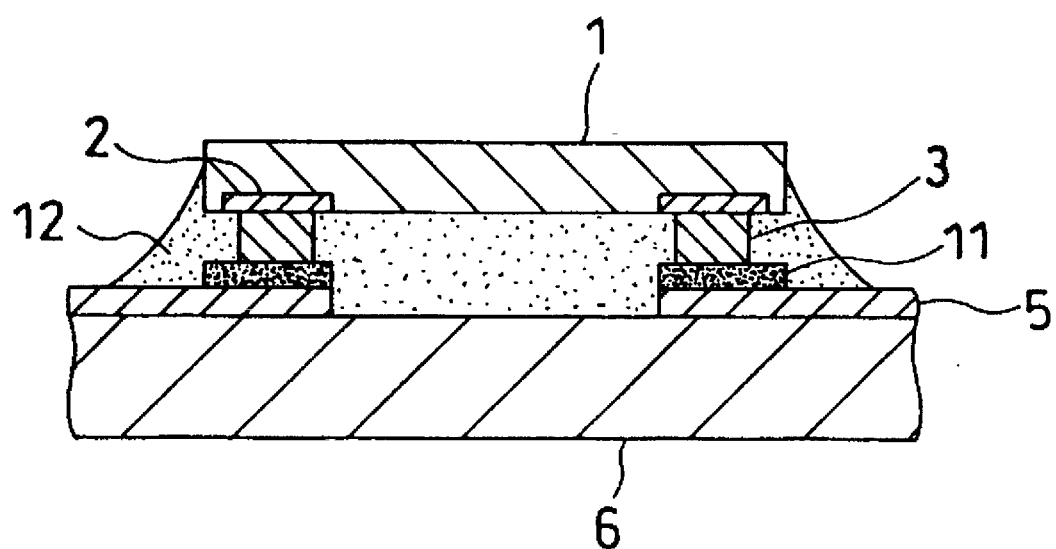
FIG. 10 is a cross section of a conventional semiconductor unit in which connection is established by making use of contraction stresses exerted when an encapsulating resin cures.

Semiconductor device 1 is mounted onto substrate 6 in a conventional way shown in FIG. 10. Bump electrode 3 is formed of gold. Gold deposit 11 is formed on terminal electrode 5. Gold deposit 11 is coated with an acrylic encapsulant. Alignment of bump electrode 3 with terminal electrode 5 is carried out. Subsequently, semiconductor device 1 is pressed by a jig while at the same time the encapsulant is cured by UV irradiation or by application of heat, to form encapsulating layer 12.

COMPARE EXAMPLE 5

Figure 11:
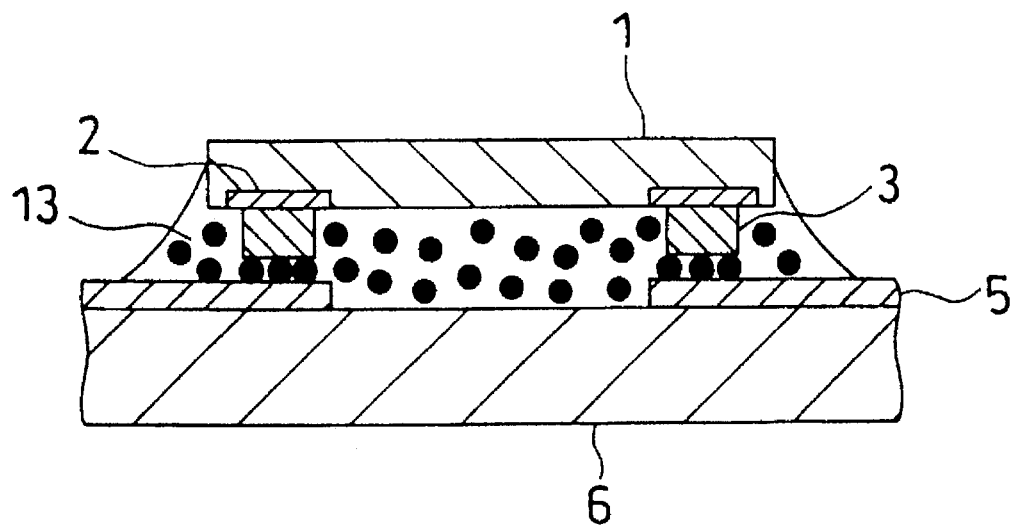
FIG. 11 is a cross section of a conventional semiconductor unit in which connection is established by an anisotropic conductive adhesive.
Figure 12:
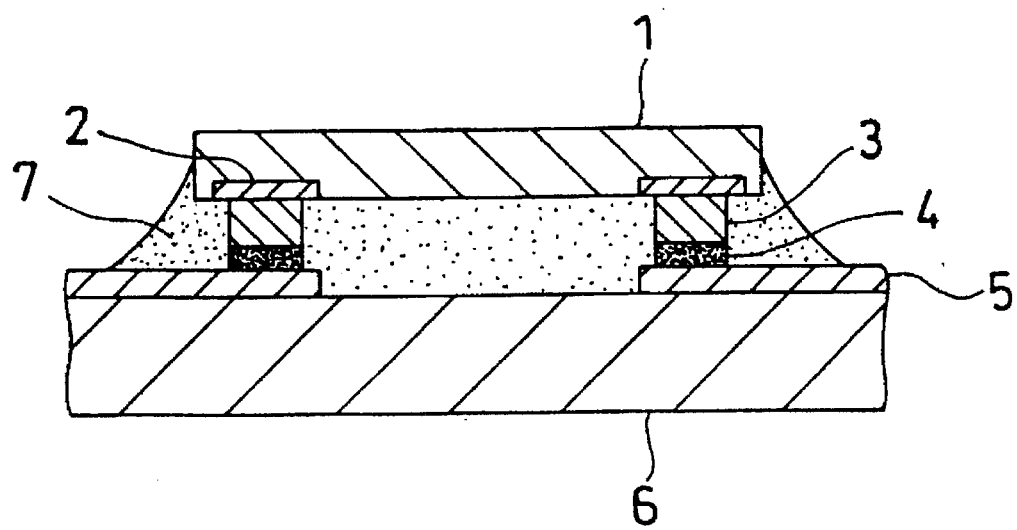
FIG. 12 is a cross section of a conventional semiconductor unit in which connection is established by a conductive adhesive.

Semiconductor device 1 is mounted onto substrate 6 in a conventional way shown in FIG. 11. Bump electrode 3 is formed of gold. Substrate 6 is formed of alumina. Alumina substrate 6 is coated with an anisotropic conductive adhesive in which particles of gold are dispersed in an epoxy binder. Alignment of bump electrode 3 and terminal electrode 5 is carried out. Thereafter, semiconductor device 1 is pressed by a jig while at the same time the adhesive is cured by UV irradiation or by application of heat, to form anisotropic conductive adhesive layer 13. As a result, bump electrode 3 and terminal electrode 5 are electrically and mechanically connected together.

The viscosity, thixotropy index, injection time of each of the encapsulant used in the first to eight embodiments and the first to fifth compare examples, are shown below (TABLE 2).

TABLE 2

| | COMP. | VISCOSITY | THIXOTROPY INDEX | TIME (min) |
|---|---|---|---|---|
| EX. 1 & EX. 2 | a | 7 Pa·s | 1.0 | 3.5 |
| EX. 3 | a | 7 Pa·s | 1.0 | 0.4 |
| EX. 4 | b | 8 Pa·s | 0.9 | 3.0 |
| EX. 5 | c | 4 Pa·s | 1.0 | 2.3 |
| EX. 6 | d | 5 Pa·s | 1.0 | 2.5 |
| EX. 7 & EX. 8 | e | 11 Pa·s | 1.0 | 0.6 |
| COMPARE EX. 1 | f | 7 Pa·s | 4.8 | 100 or more |
| COMPARE EX. 2 | g | 120 Pa·s | 1.3 | 45 |

NOTE:
VISCOSITY: measured by E-type viscometer (25° C.; 10 rpm);
THIXOTROPY INDEX: measured by E-type viscometer (25° C.; 1 rpm/10 rpm);
INJECTION TIME: time required for encapsulation of 5 mm square semiconductor chip at 25° C.

As can be seen from TABLE 2, in the embodiments of the present invention, the injection time is short falling in the range of 0.4 to 3.5 minutes. The present invention is suitable for practical applications, accordingly. Conversely, in the compare examples, the injection time is much longer than that of the present invention. The compare examples are unsuitable for practical applications. TABLE 2 shows that the injection time correlates with the viscosity/thixotropy index. In other words, in the present invention, the viscosity is low (i.e., below 100 Pa·s) and the thixotropy index is also low (i.e., below 1.1), which results in reducing the encapsulant injection time. On the other hand, in the second compare example, the viscosity exceeds 100 Pa·s and, in the first compare example, the thixotropy index exceeds 1.1, which results in greatly increasing the encapsulant injection time. To sum up, when the encapsulant viscosity is below 100 Pa·s and when the thixotropy index is below 1.1, the flowability of encapsulant becomes improved to be suitable for practical applications.

For the purpose of evaluating the stability of connection in each of the first to eighth embodiments of the present invention and the first to fifth compare examples, various environmental tests were made as shown in TABLES 3 and 4.

TABLE 3

| | TEST 1 | TEST 2 | TEST 3 | TEST 4 | TEST 5 |
|---|---|---|---|---|---|
| EX. 1 | o | o | o | o | o |
| EX. 2 | o | o | o | o | o |
| EX. 3 | o | o | o | o | o |
| EX. 4 | o | o | o | o | o |
| EX. 5 | o | o | o | o | o |

TABLE 3-continued

|        | TEST 1 | TEST 2 | TEST 3 | TEST 4 | TEST 5 |
|--------|--------|--------|--------|--------|--------|
| EX. 6  | o      | o      | o      | o      | o      |
| EX. 7  | o      | o      | o      | o      | o      |
| EX. 8  | o      | o      | o      | o      | o      |
| COMP. 1| o      | o      | x      | o      | x      |
| COMP. 2| o      | o      | x      | o      | o      |
| COMP. 3| o      | o      | x      | o      | o      |
| COMP. 4| o      | o      | x      | x      | o      |
| COMP. 5| x      | o      | o      | x      | x      |

Note:
TEST 1: semiconductor devices are subjected to a high-temperature condition for a specified period;
TEST 2: semiconductor devices are subjected to a low-temperature condition for a specified period;
TEST 3: semiconductor devices are subjected to a thermal shock;
TEST 4: semiconductor devices are subjected to a high humidity condition for a specified period;
TEST 5: solder-heat resistance testing.

TABLE 4

| CRITERION | POST-TESTING CONNECTION RESISTIVITY BELOW 200 Ω = o ABOVE 200 Ω = x |
|-----------|---------------------------------------------------------------------|
| TESTING CONDITIONS | |
| TEST 1 | 150° C.; 1000 hr |
| TEST 2 | −55° C.; 1000 hr |
| TEST 3 | 150 to −55° C.; 500 cycles |
| TEST 4 | 121° C.; 100%; 100 hr |
| TEST 5 | 270° C.; 10 sec; 5 cycles |

The evaluation results are demonstrated. As can be seen from the tables, none of the first to eighth examples of this invention suffer problems in connection stability. Each embodiment uses an encapsulant the viscosity and thixotropy index of which are below 100 Pa·s and below 1.1, respectively. Use of such a low-viscosity, low-thixotropy encapsulant achieves semiconductor unit packages of high productivity and high resistivity against various environmental conditions, regardless of the structure of bump electrodes, the type of substrate, the type of addition agent, and the type of conductive adhesive.

In each of the first to eighth embodiments, a Lewis-base compound, which interacts more strongly with a free acid than a polar group at the surface of a filler, is used as a rheology modifier. This rheology modifier not only modifies rheology but also acts as a catalyst for reaction of polyepoxide with acid anhydride. This improves the encapsulant's resistance to various environmental conditions.

The first compare example is now discussed. This compare example uses an encapsulant that is low in viscosity but high in thixotropy index and, as a result of being high in thixotropy index, the encapsulant injection time becomes long. This causes some interconnections to cut off upon application of heat and thermal shock. Such failure may be caused by the fact that when the encapsulant injection time is long the encapsulant layer holds unwanted air bubbles, as a result of which non-uniform application of thermal stress to the encapsulating layer occurs thereby damaging conductive interconnections.

The second compare example is discussed. In this compare example, the conductive adhesive used has high flexibility and the encapsulant used is, for example, a high-viscosity resin of the phenol curing type epoxy resin group. The encapsulant must be heated for the purpose of facilitating injection. This causes some interconnections to have high connection resistivity when the encapsulant is injected, and cutoff is likely to occur where unstable interconnections exist in a thermal shock resistance testing, since the encapsulant viscosity is high and the conductive adhesive's junction is damaged by stress produced when the encapsulant is injected.

The third and fourth compare examples are discussed. In these compare examples, interconnections will cut off in a relatively short time. The fourth compare example suffers great connection resistivity variation when subjected to TESTS 4 and 5. In the third compare example, interconnections fail to reduce thermal stresses and cutoff results. In the fourth compare example, the encapsulant exerts strong thermal stresses and has high water absorption, and cutoff results.

The fifth compare example is discussed. This compare example undergoes great increase in connection resistivity when subjected to TESTS 1, 4, or 5. The reason may be that the anisotropic conductive adhesive's binder has low humidity resistance, and low adhesion at high temperature. Use of an anisotropic conductive adhesive formed of a binder having high humidity resistance will cause interconnections to cut off when subjected to a thermal shock test.

A semiconductor unit package in accordance with the present invention is highly reliable against various environmental conditions. Conventionally, encapsulant, which contain polyepoxide and acid anhydride (curing agent) as a resin binder, have not been used in the flip-chip bonding method by a conductive adhesive. If a resin binder made up of polyepoxide and acid anhydride (curing agent) is used as an encapsulant for semiconductor unit packaging, this increases the thixotropy index of the encapsulant, therefore producing the problem that the encapsulant is injected to only a part of a gap between the semiconductor device and the substrate.

The inventors of the present invention discovered that a high thixotropy index results from interaction between a free acid contained in an acid anhydride and a polar group at the surface of a filler. Based on this knowledge, the present invention provides a means capable of impeding interaction between free acid and polar group.

There is another reason why an encapsulant, which contains a polyepoxide and an acid anhydride (curing agent) as a resin binder, has not been used. That is, such a resin binder undergoes hydrolysis in a high humid atmosphere, so that it has been considered that use of the resin binder causes problems in humidity resistance of connections established by a conductive adhesive, and in reliability.

It was confirmed by the present invention that even if a resin binder, which uses an acid anhydride (particularly a trialkyltetrahydro phthalic acid's anhydride) as a curing agent, is used as an encapsulant in a flip-chip bonding step, a resulting encapsulating layer has sufficient resistance to humidity to meet requirements of practical applications. Additionally, such an encapsulant is low in viscosity and also low in thixotropy index, so that even if the encapsulant is injected at room temperature (low temperature), it well penetrates even into tiny gaps. Such characteristics of the present encapsulant produce various advantageous characteristics such as high resistance to thermal shock.

In the case of conventional semiconductor unit packages wherein in a Flip-chip bonding step COMPOSITION f of TABLE 1 is used as a resin binder, the encapsulant thixotropy index is so high that air bubbles are held in the encapsulating layer. Conductive interconnections are damaged in TESTS 3 and 5. On the other hand, in the case of conventional semiconductor unit packages wherein in a flip-chip bonding step COMPOSITION g of TABLE 1 is used as a resin binder, the resin binder must be heated for injection. As a result, conductive interconnections are damaged, and resistance to thermal shock becomes low.

The invention claimed is:

1. A semiconductor unit package which comprises:
   (a) a semiconductor device having an electrode pad;
   (b) a substrate having a terminal electrode;
   (c) a bump electrode formed on said electrode pad of said semiconductor device;
   (d) a conductive adhesive layer which is formed of a conductive adhesive with flexibility and which establishes an electrical connection between said bump electrode and said terminal electrode; and
   (e) an encapsulating layer which is formed by curing a composition having a viscosity of below 100 Pa·s and a thixotropy index of below 1.1 and which fills a gap defined between said semiconductor device and said substrate in such a way that said semiconductor device and said substrate are mechanically joined together.

2. A semiconductor unit package of claim 1, wherein:
   said composition consists essentially of (A) a resin binder that contains at least a polyepoxide, a carboxylic acid's anhydride, a rheology modifier, and a latent curing accelerator, and (B) a filler that is formed of a dielectric material; and
   said rheology modifier functions to impede interaction between a free acid in said anhydride of said carboxylic acid and a polar group at the surface of said filler.

3. A semiconductor unit package of claim 2 wherein said rheology modifier contains a substance capable of selective adsorption of said free acid in said anhydride of said carboxylic acid.

4. A semiconductor unit package of claim 2 wherein said rheology modifier is a Lewis-base compound.

5. A semiconductor unit package of claim 2 wherein said rheology modifier is either a tertiary amine compound, a tertiary phosphine compound, a quaternary ammonium salt, a quaternary phosphonium salt, or a heterocyclic compound that contains in a cyclic chain thereof an atom of nitrogen.

6. A semiconductor unit package of claim 2 wherein said anhydride of said carboxylic acid in said resin binder contains at least an anhydride of an alicyclic acid.

7. A semiconductor unit package of claim 6 wherein said alicyclic acid anhydride contains at least an anhydride of a trialkyltetrahydrophthalic acid.

8. A semiconductor unit package of claim 1 wherein said bump electrode of said semiconductor device is a stud bump electrode with a two stepped protuberance.

9. A semiconductor unit packaging method wherein a semiconductor device having an electrode pad is mounted on a substrate having a terminal electrode, said method comprising:
   (a) a first step of forming a bump electrode on said electrode pad of said semiconductor device;
   (b) a second step of applying a conductive adhesive around the tip of said bump electrode;
   (c) a third step comprising:
      performing alignment of said bump electrode and said terminal electrode;
      placing said semiconductor device onto said substrate; and
      establishing, through said conductive adhesive, an electrical connection between said bump electrode and said terminal electrode;
   (d) a fourth step of preparing an encapsulant formed of a composition the viscosity and thixotropy index of which are below 100 Pa·s and below 1.1, respectively;
   (e) a fifth step of filling a gap defined between said semiconductor device and said substrate with said encapsulant; and
   (f) a sixth step of curing said encapsulant to mechanically joint said semiconductor device and said substrate.

10. A semiconductor unit packaging method of claim 9 wherein:
    said composition of said fourth step consists essentially of (A) a resin binder that contains at least a polyepoxide, an anhydride of a carboxylic acid, a rheology modifier, and a latent curing accelerator, and (B) a filler that is formed of a dielectric material; and
    said rheology modifier functions to impede interaction between a free acid in said carboxylic acid's anhydride and a polar group at the surface of said filler.

11. A semiconductor unit packaging method of claim 9 wherein said rheology modifier contains a substance, which acts also as a curing accelerator for a double-liquid type encapsulant, by such a trace amount as to prevent said substance from exhibiting its curing accelerant function.

12. A semiconductor unit packaging method of claim 10 wherein said anhydride of said carboxylic acid in said resin binder of said fourth step contains at least an anhydride of an alicyclic acid.

13. A semiconductor unit packaging method of claim 12 wherein said alicyclic acid anhydride of said fourth step contains at least an anhydride of a trialkyltetrahydrophthalic acid.

14. A semiconductor unit packaging method of claim 9 wherein said bump electrode of said first step is a stud bump electrode with a two stepped protuberance.

15. A semiconductor unit packaging method of claim 9 wherein in said fifth step said encapsulant is injected between said semiconductor device and said substrate at room temperature.

16. A semiconductor unit packaging method of claim 9 wherein in said fifth step said encapsulant is injected between said semiconductor device and said substrate under a depressurized condition.

17. A semiconductor unit packaging method of claim 9 wherein in said fourth step said composition of said encapsulant is prepared by:
    providing a mixture of an anhydride of a carboxylic acid and a part of a filler;
    subjecting said mixture to an aging process; and
    adding a polyepoxide and the remaining filler to said mixture.

18. A semiconductor unit packaging method of claim 10 wherein said rheology modifier contains a substance capable of selective adsorption of said free acid in said anhydride of said carboxylic acid.

19. A semiconductor unit packaging method of claim 10 wherein said rheology modifier is a Lewis-base compound.

20. A semiconductor unit packaging method of claim 10 wherein said rheology modifier is either a tertiary amine compound, a tertiary phosphine compound, a quaternary ammonium salt, a quaternary phosphonium salt, or a heterocyclic compound that contains in a cyclic chain thereof an atom of nitrogen.

21. An encapsulant for filling a gap between a semiconductor device and a substrate for use in the packaging of a semiconductor unit, said encapsulant essentially consisting of:

(A) a resin binder that contains at least a polyepoxide, an anhydride of a carboxylic acid, a rheology modifier, and a latent curing accelerator wherein the weight percentage of said resin binder is within the range of from 80% to 25%; and (B) a filler that is formed of a dielectric material wherein the weight percentage of said filler is within the range of from 20% to 75%;

wherein said rheology modifier functions to impede interaction between a free acid in said anhydride of said carboxylic acid and a polar group at the surface of said filler.

22. An encapsulant of claim 21 wherein said rheology modifier contains a substance capable of selective adsorption of said free acid in said anhydride of said carboxylic acid.

23. An encapsulant of claim 21 wherein said rheology modifier is a Lewis-base compound.

24. An encapsulant of claim 21 wherein said rheology modifier is either a tertiary amine compound, a tertiary phosphine compound, a quaternary ammonium salt, a quaternary phosphonium salt, or a heterocyclic compound that contains in a cyclic chain thereof an atom of nitrogen.

25. An encapsulant of claim 21 wherein said anhydride of said carboxylic acid in said resin binder contains at least an anhydride of an alicyclic acid.

26. An encapsulant of claim 25 wherein said alicyclic acid anhydride contains at least an anhydride of a trialkyltetrahydrophthalic acid.

27. An encapsulant of claim 21 wherein said resin binder and said filler are arranged to stay as a single liquid.

28. An encapsulant of claim 21,
said resin binder having a composition wherein:
  (a) the chemical equivalent ratio of said anhydride of said carboxylic acid to said polyepoxide is within the range of from 0.8 to 1.1;
  (b) the weight percentage of said curing accelerator to the entirety of said resin binder is within the range of from 0.3% to 3%; and
  (c) the weight percentage of said rheology modifier to the entirety of said resin binder is within the range of from 0.02% to 0.3%.

29. An encapsulant for filling a gap between a semiconductor device and a substrate for use in the packaging of a semiconductor unit, said encapsulant essentially consisting of:

(A) a resin binder that contains at least a polyepoxide, an anhydride of a carboxylic acid, a rheology modifier, and a latent curing accelerator wherein the weight percentage of said resin binder is within the range of from 80% to 25%; and (B) a filler that is formed of a dielectric material wherein the weight percentage of said filler is within the range of from 20% to 75%;

wherein said encapsulant is prepared by:
  providing a mixture of an anhydride of a carboxylic acid and a part of a filler;
  subjecting said mixture to an aging process; and
  adding a polyepoxide and the remaining filler to said mixture.

* * * * *